US012581770B2

(12) United States Patent
Wang et al.

(10) Patent No.: US 12,581,770 B2
(45) Date of Patent: Mar. 17, 2026

(54) MANUFACTURING METHOD OF DISPLAY PANEL AND DISPLAY DEVICE

(71) Applicant: HKC Corporation Limited, Guangdong (CN)

(72) Inventors: Ranlong Wang, Guangdong (CN); Baohong Kang, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 427 days.

(21) Appl. No.: 18/449,912

(22) Filed: Aug. 15, 2023

(65) Prior Publication Data

US 2024/0304747 A1    Sep. 12, 2024

(30) Foreign Application Priority Data

Mar. 7, 2023    (CN) .......................... 202310207209.4

(51) Int. Cl.
| | |
|---|---|
| *H10H 20/01* | (2025.01) |
| *H01L 21/66* | (2006.01) |
| *H01L 25/075* | (2006.01) |

(52) U.S. Cl.
CPC ............. *H10H 20/01* (2025.01); *H01L 22/12* (2013.01); *H01L 25/0753* (2013.01)

(58) Field of Classification Search
CPC ...... H10H 20/01; H01L 22/12; H01L 25/0753
See application file for complete search history.

(56) References Cited

U.S. PATENT DOCUMENTS

| | | | | |
|---|---|---|---|---|
| 11,355,549 B2 * | 6/2022 | Diana | .................... | H10H 20/01 |
| 11,462,522 B2 * | 10/2022 | Mun | ................... | H01L 25/0753 |

(Continued)

FOREIGN PATENT DOCUMENTS

| | | |
|---|---|---|
| CN | 109003966 B | 10/2020 |
| CN | 112567523 A | 3/2021 |

(Continued)

OTHER PUBLICATIONS

Zhang et al., CN 115249725, Oct. 28, 2022 (Year: 2022).*

(Continued)

*Primary Examiner* — Mary Ellen Bowman
(74) *Attorney, Agent, or Firm* — Scully, Scott, Murphy & Presser, P.C.

(57) ABSTRACT

The present disclosure discloses a manufacturing method of display panel and a display panel. The method includes: providing a drive substrate, the drive substrate including a plurality of drive electrodes, manufacturing an elastic layer and an adhesive layer formed that are stacked between the two drive electrodes separated by a predetermined distance; transferring light emitting units to the adhesive layer, and controlling light emitting electrodes of the light emitting units to be connected to the drive electrodes; determining the light emitting units to emit light normally when the light emitting units are controlled to emit light through the drive substrate; forming a bonding layer by filling bonding material between the light emitting electrodes of the light emitting units and the drive substrate, and the bonding layer surrounding the light emitting electrodes and the drive electrodes for increasing connection strength of the light emitting electrodes and the drive electrodes.

10 Claims, 6 Drawing Sheets

10

(56)                     References Cited

U.S. PATENT DOCUMENTS

| | | | |
|---|---|---|---|
| 2012/0211775 A1 | 8/2012 | Hosoya et al. | |
| 2017/0207249 A1* | 7/2017 | Rhee ..................... | H01L 25/167 |
| 2019/0333897 A1 | 10/2019 | Chen | |
| 2020/0402867 A1* | 12/2020 | Yanagawa ............. | H01L 25/167 |

FOREIGN PATENT DOCUMENTS

| | | | |
|---|---|---|---|
| CN | 213340423 | U | 6/2021 |
| CN | 114203725 | A | 3/2022 |
| CN | 113130728 | B | 7/2022 |
| CN | 111933775 | B | 9/2022 |
| CN | 112562525 | B | 9/2022 |
| CN | 113745391 | B | 10/2022 |
| CN | 115249725 | A | 10/2022 |
| CN | 115312653 | A | 11/2022 |
| CN | 217903134 | U | 11/2022 |
| CN | 115425120 | A | 12/2022 |

OTHER PUBLICATIONS

First Office Action dated May 9, 2023 received in Chinese Patent Application No. CN 202310207209.4.
Second Office Action dated May 27, 2023 received in Chinese Patent Application No. CN 202310207209.4.

* cited by examiner

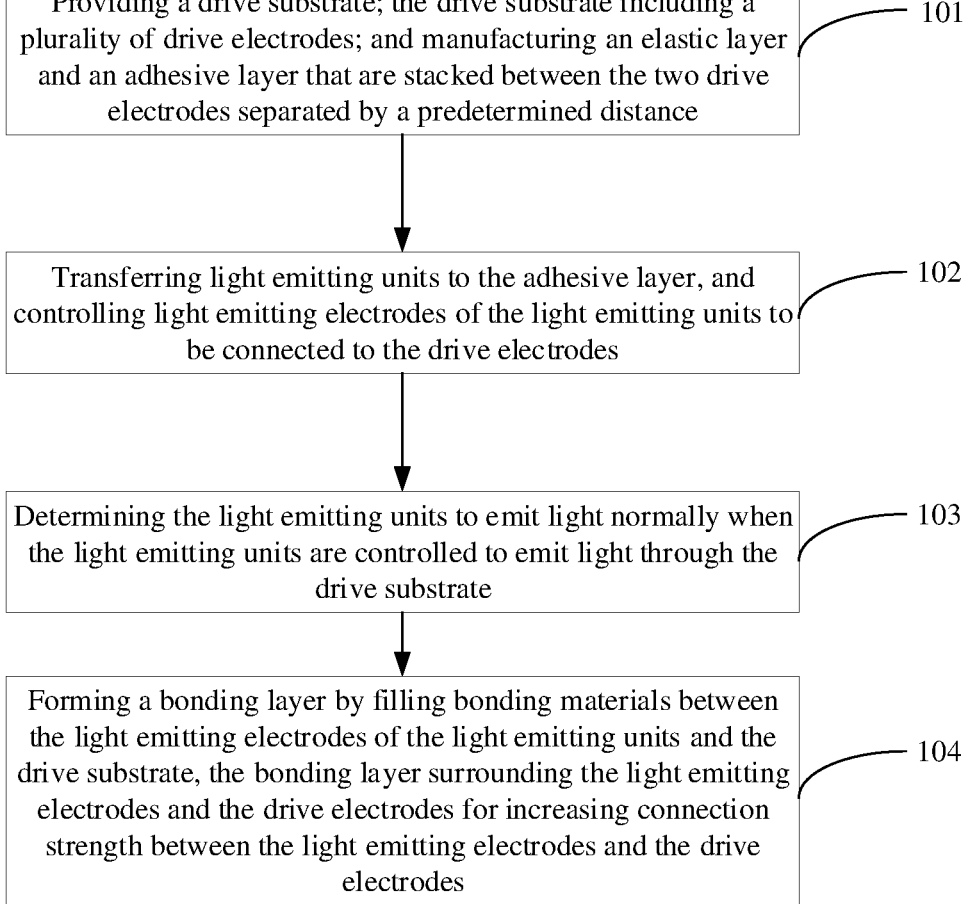

Providing a drive substrate; the drive substrate including a plurality of drive electrodes; and manufacturing an elastic layer and an adhesive layer that are stacked between the two drive electrodes separated by a predetermined distance — 101

Transferring light emitting units to the adhesive layer, and controlling light emitting electrodes of the light emitting units to be connected to the drive electrodes — 102

Determining the light emitting units to emit light normally when the light emitting units are controlled to emit light through the drive substrate — 103

Forming a bonding layer by filling bonding materials between the light emitting electrodes of the light emitting units and the drive substrate, the bonding layer surrounding the light emitting electrodes and the drive electrodes for increasing connection strength between the light emitting electrodes and the drive electrodes — 104

FIG. 4

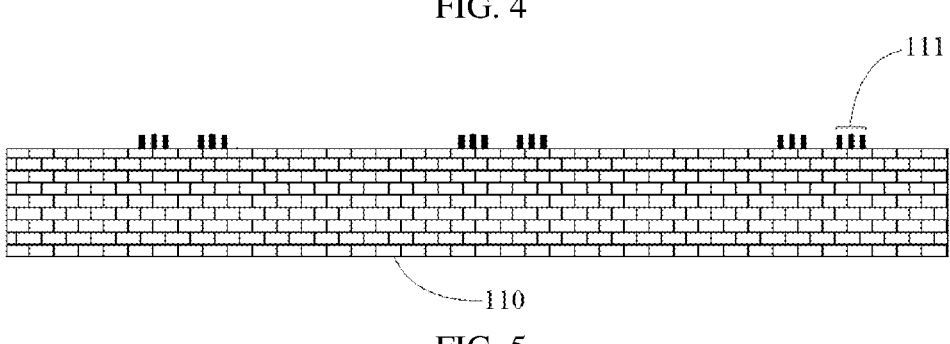

MANUFACTURING METHOD OF DISPLAY PANEL AND DISPLAY DEVICE

CROSS-REFERENCE TO RELATED APPLICATION

This application claims priority to Chinese Patent Application No. 2023102072094, filed Mar. 7, 2023, the contents of which are incorporated herein in its entirety by reference.

TECHNICAL FIELD

The present disclosure relates to fields of display technology, and in particular to a manufacturing method of display panel and a display panel.

BACKGROUND

Micro Light-Emitting Diode (Micro LED) display technology refers to taking self-luminous micron-sized LEDs as light emitting pixel units, compared with ordinary LEDs, they have higher density per unit area and smaller light source unit size. Compared with an Liquid Crystal Display (LCD), a Micro LED display offers a better display effect, and has an order of magnitude increase in response speed, a thinner and lighter screen, and a lower power consumption.

Nowadays, in a process of manufacturing a Micro-LED display panel, the Micro-LEDs are usually transferred to a drive substrate through a mass transfer, and bonded to the drive substrate through bonding materials, and then a voltage is applied to the Micro-LEDs to detect the Micro-LEDs. When one Micro-LED is detected to not light up normally, the bonding between the Micro-LED and the drive substrate needs to be unbonded and then repaired. Due to a complex fixed bonding and unbonding process, the detection and maintenance cost of Micro-LEDs are high, which leads to lower production efficiency. Therefore, how to avoid the high detection and maintenance cost of Micro-LEDs caused by an unbonding process is an urgent problem to be solved.

SUMMARY

In view of the shortcomings of the above technical problems, the present disclosure provides a manufacturing method of display panel that can effectively reduce the detection and maintenance cost, and a display panel formed by the aforementioned manufacturing method.

The present disclosure provides a manufacturing method of display panel. The method includes: providing a drive substrate, the drive substrate including a plurality of drive electrodes; manufacturing an elastic layer and an adhesive layer that are stacked between the two drive electrodes separated by a predetermined distance; transferring light emitting units to the adhesive layer, and controlling light emitting electrodes of the light emitting units to be connected to the drive electrodes; determining the light emitting units to emit light normally when the light emitting units are controlled to emit light through the drive substrate; forming a bonding layer by filling bonding material between the light emitting electrodes of the light emitting units and the drive substrate, and the bonding layer surrounding the light emitting electrodes and the drive electrodes for increasing connection strength of the light emitting electrodes and the drive electrodes.

The present disclosure also provides a display panel. The display panel includes a drive substrate and a display medium layer. The drive substrate is used to output data signals to the display medium layer, and control the display medium layer to display images according to the data signals. The drive substrate includes a plurality of drive electrodes. The display medium layer includes an elastic layer, an adhesive layer, a bonding layer and a plurality of light emitting units. The elastic layer and the adhesive layer are stacked on the drive substrate and positioned between two drive electrodes spaced at a predetermined distance. The light emitting electrodes of the light emitting unit are electrically connected to the two drive electrodes spaced at the predetermined distance. The light emitting unit is used to receive drive signals from the drive electrodes. The bonding layer is formed by filling bonding materials between the light emitting electrodes and the drive substrate after all the light emitting units are determined to emit light normally. The bonding layer surrounds the light emitting electrodes and the drive electrodes. The bonding layer is used to increase connection strength between the light emitting electrodes and the drive electrodes.

Compared to the prior art, during a manufacturing process of a display panel, before the light emitting units are bonded to the drive substrate, the light emitting units which are not being transferred successfully, are detected and repaired, avoiding to repair the light emitting units after they have been bonded to the drive substrate and bypassing a complex step of unbonding, which greatly reduces a repairing cost of manufacturing the display panel and effectively improves a production efficiency of the display panel. In addition, since there is no need to unbond, the damage to the light emitting units and the drive substrate caused by the unbonding process and the resulting display abnormalities are avoided, effectively ensuring the display effects and quality of the display panel.

BRIEF DESCRIPTION OF THE ACCOMPANYING DRAWINGS

In order to more clearly illustrate the technical solutions in the embodiments of the present disclosure, a brief description of the accompanying drawings to be used in the embodiments will be given below. Obviously, the accompanying drawings in the following description are some embodiments of the present disclosure, for a person of ordinary skill in the art, other accompanying drawings may be obtained on the basis of these drawings without any creative effort.

FIG. 4 illustrates a flow diagram of a manufacturing method of display panel in accordance with a second embodiment of the present disclosure.

FIG. 5 illustrates a structural schematic diagram of a drive electrode in the drive substrate.

THE DESCRIPTION OF REFERENCE SIGNS

Figure 1:
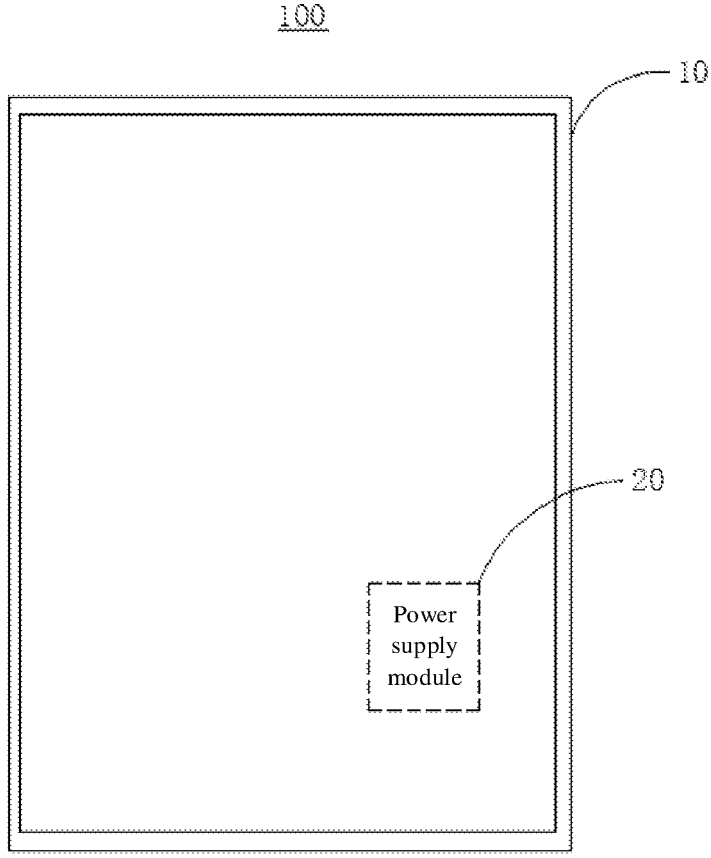
FIG. 1 illustrates a structural schematic diagram of a display terminal in accordance with an embodiment of the present disclosure.

100—display terminal: 10—display panel; 20—power supply module; 10*a*—display area; 10*c*—array substrate; D1~Dm—m data line; S1~Sn—n scan line; F1—first direction; F2—second direction; 11—time control circuit; 12—data drive circuit; 13—scan drive circuit; P—pixel unit; 110—drive substrate; 120—display medium layer; 111—drive electrode; 121—light emitting unit; 121*a*—light emitting electrode; 122—flat layer; 122*a*—first trench; 122*b*—second trench; 123—blackening layer; 124—elastic layer; 125—adhesive layer; 126—bonding layer; 127—encapsulating layer.

DETAILED DESCRIPTION OF ILLUSTRATED EMBODIMENTS

In order to facilitate an understanding of the present disclosure, the following will be described more fully with reference to the relevant accompanying drawings. A preferred embodiment of the present disclosure is given in the accompanying drawings. However, the present disclosure can be implemented in many different forms and is not limited to the embodiments described herein. To the opposite, these embodiments are provided for the purpose of providing a more thorough and comprehensive understanding of a disclosure of this application.

The following embodiments are described with reference to attached drawings to exemplify particular embodiments in which the present disclosure may be implemented. The serial numbers themselves, such as "first", "second", etc., given to the components herein are used only to distinguish the objects described and do not have any sequential or technical meaning. The directional terms mentioned in this application, for example, "up", "down", "front", "back" "left", "right", "inside", "outside", "side", etc., are merely references to the orientation of the attached drawings. Therefore, the orientation terms used are for the purpose of better and clearer description and understanding of the present disclosure, and do not indicate or imply that the device or element referred to must have a specific orientation, be constructed and operated in a specific orientation, and therefore cannot be construed as a limitation of the present disclosure.

In the description of the present disclosure, it should be noted that, unless otherwise expressly specified and limited, the terms "mounted", "connected to", "connected" are to be understood in a broad sense. For example, they may be a fixed connection, a removable connection, a one-piece connection, a mechanical connection, a direct connection, an indirect connection through an intermediate medium, or may be a connection within two components. For a person of ordinary skill in the art, the specific meaning of the above terms in the context of the present disclosure can be understood in specific cases. It should be noted that the terms "first", "second" and the like in the specification and claims of the present disclosure and in the accompanying drawings are used to distinguish between different objects and are not intended to describe a particular order.

In addition, the terms "include," "may include," "comprise" or "may include" as used in the present disclosure denotes the existence of the corresponding function, operation, component, etc. and does not limit one or more other further functions, operations, components, etc. In addition, the terms "include" or "comprise" denote the presence of the corresponding features, numbers, steps, operations, elements, components, or combinations thereof disclosed in the specification, without excluding the presence or addition of one or more other features, numbers, steps, operations, elements, components, or combinations thereof, with the intent to cover non-exclusive inclusion. In addition, when describing embodiments of the present disclosure, the term "may" is used to denote "one or more embodiments of the present disclosure". Also, the term "exemplary" is intended to refer to examples or illustrations.

Unless otherwise defined, all technical and scientific terms used herein have the same meaning as commonly understood by those skilled in the art belonging to the present disclosure. The terms used herein in the specification of the present disclosure are used only for the purpose of describing specific embodiments and are not intended to limit the present disclosure.

Referring to FIG. 1, FIG. 1 illustrates a structural schematic diagram of a display terminal 100 in accordance with a first embodiment of the present disclosure. The display terminal 100 includes a display panel 10 and a power supply module 20. The power supply module 20 is located on a back surface of the display panel 10, i.e., a non-display surface of the display panel 10. The power supply module 20 is used to provide a drive voltage for the display panel 10 to perform image display in order to maintain the display panel 10 to perform image display.

Figure 2:
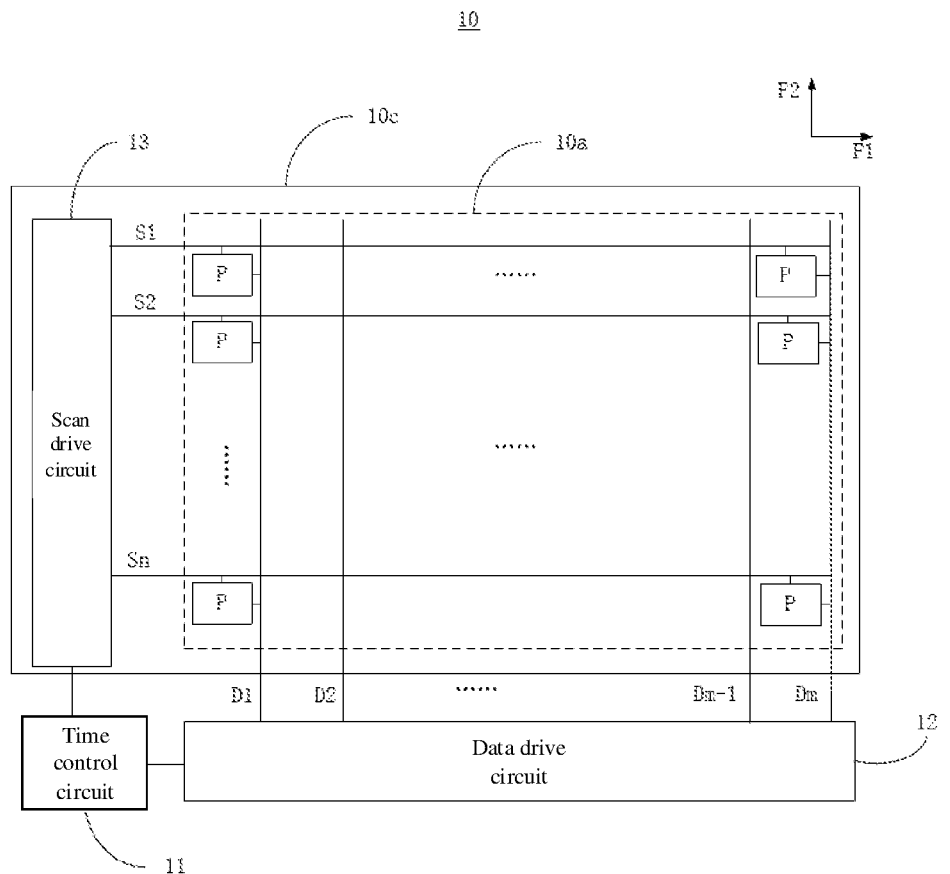
FIG. 2 illustrates a circuit schematic view of a display terminal in FIG. 1.

Referring to FIG. 2, FIG. 2 illustrates a schematic diagram of a plane layout of the display panel 10 shown in FIG. 1. As shown in FIG. 2, the display area 10*a* of the display panel 10 includes a plurality of m*n pixel units P arranged in a matrix, m data lines D1~Dm, and n scan lines S1~Sn, where m and n are natural numbers greater than 1.

The n scan lines S1 to Sn extend along a first direction F1 and are insulated from each other and arranged in parallel along a second direction F2. The m data lines D1 to Dm extend along the second direction F2 and are insulated from each other and arranged in parallel along the first direction F1, where the first direction F1 and the second direction F2 are perpendicular to each other.

For a non-display area of the display panel 10, the display terminal 100 further includes a time control circuit 11 for driving the pixel unit P for image display, a data drive circuit 12 and a scan drive circuit 13 located in the array substrate 10*c*.

The time control circuit 11 is electrically connected to the data drive circuit 12 and the scan drive circuit 13. The time control circuit 11 is used to control the operating timing of the data drive circuit 12 and the scan drive circuit 13, i.e., to output corresponding timing control signals to the data drive circuit 12 and the scan drive circuit 13, to control when the scan drive circuit 13 outputs the corresponding scan signal as well as when the data drive circuit 12 outputs the data signal.

The data drive circuit 12 is electrically connected to the m data lines D1 to Dm, and is used to transmit the data signals (Data) to be displayed to the plurality of pixel units P in the form of data voltages through the m data lines D1 to Dm.

The scan drive circuit 13 is electrically connected to the n scan lines S1 to Sn and is used to output scan signals through the n scan lines S1 to Sn for controlling when the pixel unit P receives data signals. The scan drive circuit 13 outputs scan signals from the n scan lines S1, S2, . . . to Sn arranged in an order of position arrangement of scan lines S1~Sn and following a scanning period.

Figure 3:
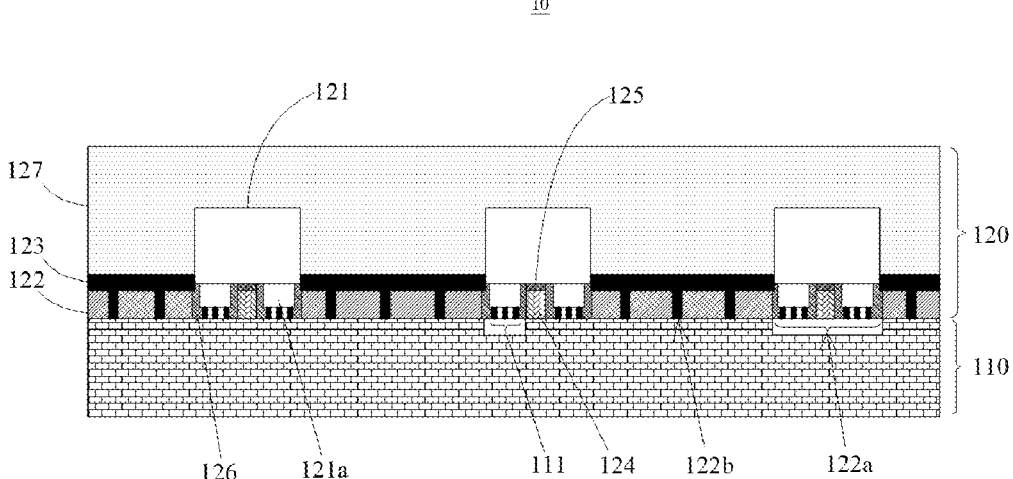
FIG. 3 illustrates a cross-sectional structural schematic diagram of a display panel in FIG. 1.

Referring to FIG. 3, FIG. 3 illustrates a cross-sectional schematic diagram of the display panel in FIG. 1.

As shown in FIG. 3, the display panel 10 includes a drive substrate 110 and a display medium layer 120, where the drive substrate 110 is used to lay n scan lines S1 to Sn, m data lines D1 to Dm, to provide data signals for the display medium layer 120 and to control the light emitted by the display medium layer 120 at a preset grey level. The drive substrate 110 includes a plurality of drive electrodes 111, which are used to electrically connect to the light emitting units 121 in the display medium layer 120, and used for outputting data signals to the light emitting units 121. Two drive electrodes 111 spaced at a predetermined distance are a set of drive electrodes. A set of drive electrodes is used to connect a light emitting unit 121. The light emitting unit 121 corresponds to a pixel unit P. The plurality of light emitting units 121 emit light in a predetermined grey level to form an image so as to perform image display.

The display medium layer 120 includes a plurality of light emitting units 121. Each light emitting unit 121 includes two light emitting electrodes 121a. The two light emitting electrodes 121a are electrically connected to two drive electrodes 111 of the set of drive electrodes for receiving data signals for image display from the drive electrodes 111. The light emitting unit 121 may be a micro light emitting diode (Micro-LED).

The display medium layer 120 further includes a flat layer 122. The flat layer 122 is stacked on one side of the drive substrate 110. The flat layer 122 and the light emitting unit 121 are located on a same side of the drive substrate 110. The flat layer 122 includes a plurality of first trenches 122a and a plurality of second trenches 122b. At least one second trench 122b is located between each of the two adjacent first trenches 122a. The light emitting electrodes 121a of the plurality of light emitting units 121 are connected to the drive electrodes 111 through the first trenches 122a, i.e., the light emitting electrodes 121a and the drive electrodes 111 are embedded in the first trenches 122a. With the plurality of first trenches 122a, the transfer accuracy of the light emitting units 121 can be effectively improved when transferring the plurality of light emitting units 121 to the drive substrate 110 due to the limitation of the light emitting units 121 by the first trenches 122a, i.e., the transfer accuracy of the micro-LEDs can be effectively improved when transferring the micro-LEDs in mass transfer.

The flat layer 122 may include at least one organic material, for example, it may include polymethyl methacrylate, polystyrene, polymeric derivatives of phenolic groups, propylene-based polymers, imide-based polymers, aryl ether-based polymers, amide-based polymers, fluorine-based polymers, p-dimethylphenyl polymers, vinyl alcohol-based polymers, etc. The flat layer 122 can be set as a combination of one or more of the above materials according to specific needs, and the present disclosure does not limit this.

The display medium layer 120 further includes a blackening layer 123. The blackening layer 123 is stacked on one side of the flat layer 122 away from the drive substrate 110 and partially filled in the plurality of second trenches 122b, i.e., the blackening layer 123 is partially embedded in the pre-defined second trenches 122b of the flat layer 122. By partially filling the blackening layer 123 in the second trench 122b, the adhesion and reliability between the blackening layer 123 and the flat layer 122 is improved. The blackening layer 123 is produced by inkjet printing. The blackening layer 123 is used to improve a contrast ratio of the image display of the display panel 10.

The display medium layer 120 also includes an elastic layer 124 and an adhesive layer 125. The elastic layer 124 and the adhesive layer 125 are stacked on the drive substrate 110 and located between the two drive electrodes 111 spaced at the predetermined distance, i.e., the elastic layer 124 and the adhesive layer 125 are located in one first trench 122a, the elastic layer 124 is stacked on one side of the drive substrate 110, and the adhesive layer 125 is stacked on one side of the elastic layer 124 away from the drive substrate 110.

The elastic layer 124 and the adhesive layer 125 are located in the first trench 122a. The two light emitting electrodes 121a of the light emitting unit 121 are connected to the drive electrodes 111 through the elastic layer 124 and the adhesive layer 125 on each side, respectively, i.e., the elastic layer 124 and the adhesive layer 125 are stacked between the two light emitting electrodes 121a of the light emitting unit 121. The elastic layer 124 is set adjacent to and stacked to the drive substrate 110, and the adhesive layer 125 is set stacked to the side of the elastic layer 124 away from the drive substrate 110, and the adhesive layer 125 is used to bond and fix the light emitting unit 121.

When the light emitting units 121 have been transferred to the drive substrate 110, the light emitting units 121 are fixed by the adhesive layer 125. After fixing, the entire surfaces of the light emitting units 121 are pressurized to control the light emitting electrodes 121a of the light emitting units 121 to be connected to the drive electrodes 111, and the elastic layer 124 is used to prevent damage to the light emitting units 121 during a whole surface pressurization.

After the light emitting units 121 are transferred to the drive substrate 110, the light emitting units 121 are controlled by the drive substrate 110 to emit light, so as to detect the light emitting units 121 that are not electrically connected to the drive electrodes 111, i.e., the light emitting units 121 are lit up to determine the lighting emitting units 121 that are not electrically connected; and the lighting emitting units 121 that are not electrically connected can be repaired by adjusting the angle of the lighting emitting units 121 or replacing the lighting emitting units 121 so that the lighting emitting units 121 are electrically connected to the drive electrodes 111 and can all be lit up.

In the exemplary embodiment, the elastic layer 124 can be a UV lithographic acrylic resin, which is formed by coating, exposing, developing and baking, and the thickness can be set to between 1 um and 5 um, and the shape can be set to rectangular, round and square, etc., without any limitation in this application. Preferably, the size of the elastic layer 124 is smaller than the size of the light emitting unit 121, i.e., the elastic layer 124 is completely covered by the light emitting unit 121 in a vertical direction or rather in a thickness direction.

In the exemplary embodiment, the adhesive layer 125 can be an acrylic material, which is formed on one side of the elastic layer 124 by printing, irradiated with UV light for 30 minutes and then baked at 180° C. for 30 minutes, so as to achieve the manufacture of the adhesive layer 125. The shape of the adhesive layer 125 may be the same as or different from the elastic layer 124. However, the dimension of the adhesive layer 125 in a thickness direction are less than or equal to the dimension of the elastic layer 124 in a thickness direction, and the thickness of the adhesive layer 125 may be between 1 um~2 um.

The display medium layer 120 further includes a bonding layer 126. The bonding layer 126 is located between the flat layer 122 and the elastic layer 124, i.e., the bonding layer 126 is located between the light emitting electrode 121a and the flat layer 122, and between the light emitting electrode 121*a* and elastic layer 124, i.e., the bonding layer 126 is located in the first trenches 122*a* in addition to the space of the light emitting electrodes 121*a*, the drive electrodes 111, the elastic layer 124 and the adhesive layer 125, for electrically connecting and bonding the light emitting electrodes 121*a* of the light emitting units 121 to the drive electrodes 111, so that the light emitting units 121 are electrically connected to drive substrate 110. In detail, during a pressurization of the light emitting units 121, the electrical detection and repair of the light emitting units 121 can be carried out. After the repair of the light emitting units 121 is determined to be completed, the bonding layer 126 is formed by filling the bonding materials between the flat layer 122 and the elastic layer 124. The bonding materials may be solder or anisotropic conductive film (ACF), where the solder may be a gold-tin alloy, indium, indium titanide or the like.

The display medium layer 120 also includes an encapsulating layer 127. The encapsulating layer 127 covers one side of the light emitting units 121 away from the drive substrate 110. The encapsulating layer 127 is used to provide hydro-oxygen protection to the light emitting units 121 and to reduce surface reflections of the light emitting units 121. The encapsulating layer 127 can be a translucent epoxy or silicone resin with a transmission rate of 40% to 70%.

The current and voltage of the light emitting units 121 can be detected before the bonding materials are filled to form the bonding layer 126, so as to confirm the light emitting status of the light emitting units 121. When one light emitting unit 121 cannot emit light, that is, when the Micro-LED cannot be lit, the light emitting unit 121 can be repaired and replaced directly without first unbonding and then repairing, which greatly reduces the maintenance cost of the panel and improves the maintenance and production efficiency of the light emitting unit 121, thus enhancing the production efficiency of the display panel 10.

Referring to FIG. 4, FIG. 4 illustrates a flow diagram of a manufacturing method of display panel in accordance with a second embodiment of the present disclosure. As shown in FIG. 4, the specific steps include as follows.

S101, a drive substrate is provided; the drive substrate includes a plurality of drive electrodes; and an elastic layer and an adhesive layer are manufactured to be stacked between the two drive electrodes separated by a predetermined distance.

Please also referring to FIG. 5, FIG. 5 illustrates a structural schematic diagram of the drive electrodes in the drive substrate.

As shown in FIG. 5, a plurality of drive electrodes 111 are manufactured on one side of the drive substrate 110; two adjacent drive electrodes 111 are a set of drive electrodes, and a set of drive electrodes is used to connect two light emitting electrodes 121*a* of one light emitting unit 121. The drive substrate 110 provides data signals for image display to the light emitting units 121 via the drive electrodes 111, and the light emitting units 121 perform image display based on the received data signals.

Figures 6, 7, 8:
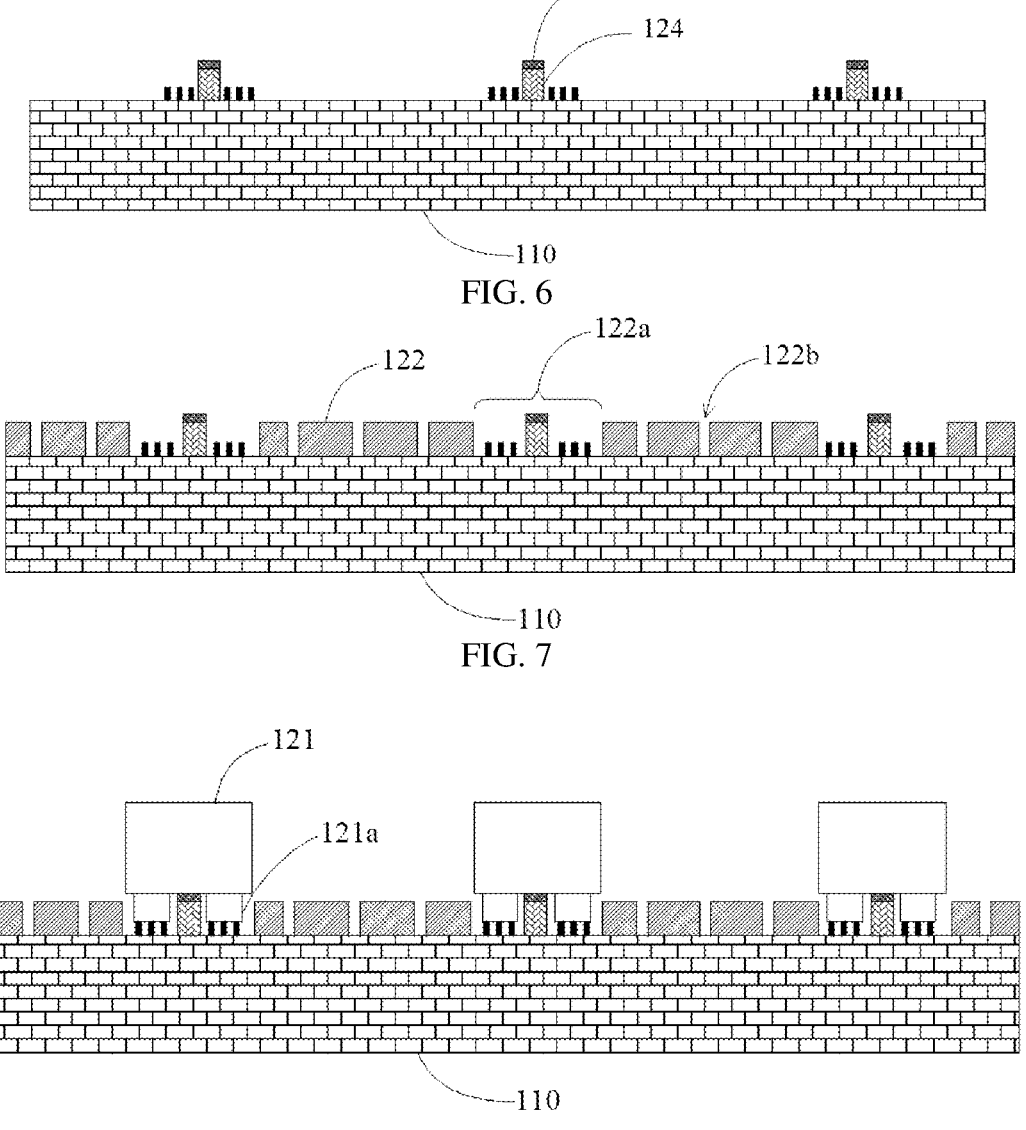
FIG. 6 illustrates a manufacturing structural schematic diagram of an elastic layer and an adhesive layer in the drive substrate.
FIG. 7 illustrates a structural schematic diagram a flat layer in the drive substrate.
FIG. 8 illustrates a schematic diagram of connections between the light emitting units and the drive electrodes.

Referring together to FIG. 6. FIG. 6 illustrates a manufacturing structural schematic diagram of the elastic layer and the adhesive layer in the drive substrate. As shown in FIG. 6, between two drive electrodes 111 separated by a predetermined distance, where the predetermined distance is a distance between two drive electrodes 111 in a set of drive electrodes, i.e., the elastic layer 124 and the adhesive layer 125 are stacked between two drive electrodes 111 of a set of drive electrodes, the elastic layer 124 is stacked on a surface of the drive substrate 110 manufacturing the drive electrode 111, and the adhesive layer 125 is stacked on one side of the elastic layer 124 away from the drive substrate 110. The elastic layer 124 is used to cushion the light emitting unit 121 when the light emitting electrodes 121*a* are connected to the drive electrodes 111 to prevent damage to the light emitting unit 121 during a transfer and connection process. The adhesive layer 125 is used to bond and secure the light emitting unit 121 when the light emitting electrodes 121*a* are connected to the drive electrodes 111.

Referring to FIG. 7, FIG. 7 is a structural schematic diagram of a flat layer in the drive substrate. As shown in FIG. 7, a flat layer 122 is formed on one side of the drive substrate 110 where the drive electrodes 111 are made by chemical deposition, etc. The flat layer 122 covers part of the drive substrate 110. The first trench 122*a* is opened at a position where the flat layer 122 coincides with the drive electrodes 111 to expose the drive electrodes 111, as well as the elastic layer 124 and the adhesive layer 125, i.e., the drive electrodes 111 and the elastic layer 124 and the adhesive layer 125 between the two drive electrodes 111 are located in the first trench 122*a*, and at least one second trench 122*b* is opened between the two first trenches 122*a* adjacent to each other.

The flat layer 122 includes at least one organic material, which may, for example, include polymethyl methacrylate, polystyrene, polymeric derivatives of phenolic groups, propylene-based polymers, imide-based polymers, aryl ether-based polymers, amide-based polymers, fluorine-based polymers, p-dimethylphenyl polymers, vinyl alcohol-based polymers, etc. The flat layer 122 may be a combination of one or more of these materials.

S102, the light emitting units are transferred to the adhesive layer, and the light emitting electrodes of the light emitting units are controlled to be connected to the drive electrodes.

Referring to FIG. 8, FIG. 8 illustrates a schematic diagram of connections between the light emitting units and the drive electrodes.

As shown in FIG. 8, a plurality of light emitting units 121 are transferred to one side of the drive substrate 110 where the flat layer 122 is located; the light emitting units 121 are bonded by the adhesive layer 125, and then the entire surfaces of the plurality of light emitting units 121 are pressurized so that the lighting emitting electrodes 121*a* of the light emitting units 121 are connected to the drive electrodes 111 in the first trenches 122*a*, and the elastic layer 124 is used as a cushion during the pressurization of the entire surfaces of the light emitting units 121, to prevent the light emitting units 121 from damage during a pressurization process.

S103, the light emitting units are determined to emit light normally when the light emitting units are controlled to emit light through the drive substrate.

The drive substrate 110 outputs data signals for image display to the plurality of light emitting units 121 to control the lighting of the plurality of light emitting units 121, and then detects the light emitting units 121 that are not electrically connected to the drive electrode 111, i.e., the light emitting units 121 are lit up to determine the light emitting units 121 that are not electrically connected, and the light emitting unit 121 that are not electrically connected are repaired, either by adjusting the angle of the light emitting units 121 or by replacing the light emitting units 121 so that all light emitting units 121 are connected to the corresponding drive electrodes 111, and can emit light normally.

S104, the bonding layer is formed by filling the bonding material between the light emitting electrodes of the light emitting units and the drive substrate, the bonding layer surrounds the light emitting electrodes and the drive electrodes, and are used to increase connection strength between the light emitting electrodes and the drive electrodes.

Figure 9:
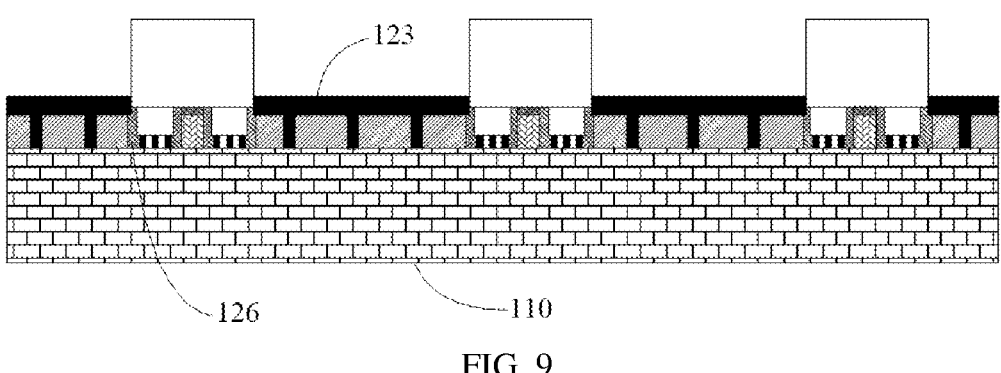
FIG. 9 illustrates a structural schematic diagram of the bonding layer and the blackening layer.

Referring to FIG. 9, FIG. 9 illustrates a structural schematic diagram of the bonding layer and the blackening layer.

As shown in FIG. 9, the bonding layer 126 is formed by filling the bonding materials between the light emitting electrodes 121a of the light emitting units 121 and the drive substrate 110, i.e., the bonding layer 126 is formed by filling the bonding materials in the first trenches 122a, in addition to the space of the light emitting electrodes 121a, the drive electrodes 111, the elastic layer 124 and the adhesive layer 125, so that the bonding materials fill the gap between the drive electrodes 111, the flat layer 122 and the elastic layer 124. The bonding layer 126 is used to reinforce a connection between the light emitting unit 121 and the drive electrodes 111.

The bonding material can be a solder or anisotropic conductive film (ACF), where the solder can be a gold-tin alloy, indium, indium stannide, etc. The encapsulating layer 127 can be a translucent epoxy resin or silicone resin material. The transmission rate can be set at 40% to 70%.

After the bonding layer 126 has been formed, the blackening layer 123 is formed on one side of the light emitting units 121 away from the drive substrate 110. The blackening layer 123 covers the flat layer 122 and partially fills within the second trenches 122b. The blackening layer 123 can be formed by inkjet printing. The blackening layer 123 covers a surface of the flat layer 122 and fills the preset second trenches 122b to enhance the adhesion force between the blackening layer 123 and the drive substrate 110, so as to improve the overall reliability.

After the blackening layer 123 is completed, the encapsulating layer 127 is formed by depositing encapsulating material on one side of the blackening layer 123 away from the flat layer 122.

During a process of manufacturing the display panel, before the light emitting units are bonded to the drive substrate, the light emitting units that are not transferred successfully are detected and repaired, avoiding to repair the light emitting units after they have been bonded to the drive substrate and bypassing a complex step of unbonding, which greatly reduces the cost of repairing the display panel during the production process and increases the production efficiency of the display panel. Moreover, since there is no need for unbonding, the damage to the light emitting units and drive substrate caused by the unbonding process is avoided and the display effect and quality of the display panel is effectively ensured.

It should be understood that the application of the present disclosure is not limited to the above examples, but can be improved or modified according to the above description for those of ordinary skill in the art, and all such improvements and modifications shall fall within the protection scope of the appended claims of the present disclosure.

What is claimed is:

1. A manufacturing method of display panel, comprising:
providing a drive substrate comprising a plurality of drive electrodes, and manufacturing an elastic layer and an adhesive layer that are stacked between two drive electrodes separated by a predetermined distance;
transferring light emitting units to the adhesive layer, and controlling light emitting electrodes of the light emitting units to be connected to the drive electrodes;

determining the light emitting units to emit light normally when the light emitting units are controlled to emit light through the drive substrate; and
forming a bonding layer by filling bonding material between the light emitting electrodes of the light emitting units and the drive substrate, wherein the bonding layer surrounds the light emitting electrodes and the drive electrodes for enhancing connection strength of the light emitting electrodes and the drive electrodes.

2. The manufacturing method of display panel according to claim 1, wherein the elastic layer is stacked on the drive substrate, and the adhesive layer is stacked on one side of the elastic layer away from the drive substrate.

3. The manufacturing method of display panel according to claim 1, wherein the transferring light emitting units to the adhesive layer, and the controlling light emitting electrodes of the light emitting units to be connected to the drive electrodes comprises:
manufacturing a flat layer on a surface of the drive substrate adjacent to the drive electrodes, wherein the flat layer covers part of the drive substrate; and
forming first trenches and second trenches in the flat layer, where the drive electrodes and the elastic layer are located in the first trench; and at least one second trench is located between two adjacent first trenches.

4. The manufacturing method of display panel according to claim 3, wherein the transferring light emitting units to the adhesive layer, and the controlling light emitting electrodes of the light emitting units to be connected to the drive electrodes further comprises:
after transferring the light emitting units to the adhesive layer, pressing entire surfaces of the light emitting units to control the light emitting electrodes of the light emitting units to be connected to the drive electrodes.

5. The manufacturing method of display panel according to claim 4, wherein the determining the light emitting units to emit light normally when the light emitting units are controlled to emit light through the drive substrate comprises:
adjusting or repairing abnormal one light emitting unit which is abnormal when the light emitting unit is detected to be abnormal during a detection of controlling the light emitting units to emit light, to make sure that all light emitting units emit light normally.

6. The manufacturing method of display panel according to claim 5, wherein the forming a bonding layer by filling bonding material between the light emitting electrodes of the light emitting units and the drive substrate comprises:
forming the bonding layer by filling the bonding materials in the first trenches;
forming a blackening layer on one side of the flat layer away from the drive substrate, where part of the blackening layer is filled and embedded in the second trenches; and
forming an encapsulation layer on one side of the blackening layer away from the flat layer for encapsulating the light emitting units.

7. A display panel, comprising a drive substrate and a display medium layer, the drive substrate being used to output data signals to the display medium layer, and control the display medium layer to display images according to the data signals;
wherein:
the drive substrate comprises a plurality of drive electrodes;

the display medium layer comprises an elastic layer, an adhesive layer, a bonding layer and a plurality of light emitting units;

the elastic layer and the adhesive layer are stacked on the drive substrate and positioned between two drive electrodes spaced at a predetermined distance;

the light emitting electrodes of one light emitting unit are electrically connected to the two drive electrodes spaced at a predetermined distance;

the light emitting unit is used to receive drive signals from the drive electrodes;

the bonding layer is formed by filling bonding materials between the light emitting electrodes and the drive substrate after the light emitting units are determined to emit light normally;

the bonding layer surrounds the light emitting electrodes and the drive electrodes; and the bonding layer is used to increase connection strength between the light emitting electrodes and the drive electrodes.

8. The display panel according to claim 7, wherein the elastic layer is stacked adjacent to the drive substrate, and the adhesive layer is stacked on one side of the elastic layer away from the drive substrate.

9. The display panel according to claim 8, wherein:

the display medium layer further comprises a flat layer;

the flat layer is stacked on one side of the drive substrate manufacturing the drive electrodes;

the flat layer comprises a plurality of first trenches and a plurality of second trenches, any two drive electrodes spaced at a predetermined distance, an elastic layer and an adhesive layer stacked between the two drive electrodes are located in the first trench; and at least one second trench is located between any two adjacent first trenches.

10. The display panel according to claim 9, wherein:

the display medium layer further comprises a blackening layer and an encapsulating layer;

the blackening layer is stacked on one side of the flat layer away from the drive substrate, wherein part of the blackening layer is also filled and embedded in the second trench; and the encapsulation layer is stacked on one side of the blackening layer away from the flat layer for encapsulating the light emitting units.

* * * * *